(12) United States Patent
Ohsawa

(10) Patent No.: US 7,376,031 B2
(45) Date of Patent: May 20, 2008

(54) SEMICONDUCTOR MEMORY DEVICE AND METHOD FOR DRIVING SEMICONDUCTOR MEMORY DEVICE

(75) Inventor: Takashi Ohsawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 114 days.

(21) Appl. No.: 11/432,397

(22) Filed: May 12, 2006

(65) Prior Publication Data

US 2007/0109891 A1    May 17, 2007

(30) Foreign Application Priority Data

Nov. 11, 2005    (JP)    .............................. 2005-327081

(51) Int. Cl.
*G11C 7/02*    (2006.01)

(52) U.S. Cl. ...................................... 365/207; 365/210

(58) Field of Classification Search ................. 365/207, 365/210, 205
See application file for complete search history.

(56) References Cited

U.S. PATENT DOCUMENTS 5,973,983 A * 10/1999 Hidaka .................. 365/230.03
6,469,546 B2 * 10/2002 Matano ........................ 327/51
7,277,341 B2 * 10/2007 Fujita et al. ................. 365/206
2005/0232043 A1   10/2005 Ohsawa

* cited by examiner

*Primary Examiner*—Anh Phung
(74) *Attorney, Agent, or Firm*—Oblon, Spivak, McClelland, Maier & Neustadt, P.C.

(57) ABSTRACT

A semiconductor memory device includes a memory cell including a floating body; a word line connected to a gate of the memory cell; a data bit line connected to the memory cell and transmitting the data stored in the memory cell; a reference bit line transmitting a reference voltage; a data sense node connected to the data bit line and transmitting the data in the memory cell; a reference sense node connected to the reference bit line and transmitting the reference voltage; a plurality of transfer gates connected between the data bit line and the data sense node and between the reference bit line and the reference sense node, respectively; and a current load circuit connected to each of the data sense node and the reference sense node and constituted by a transistor equal in conduction type to the memory cell.

18 Claims, 8 Drawing Sheets

SN ⋯ DATA SENSE NODE
BSN ⋯ REFERENCE SENSE NODE
TGL1, TGL2 ⋯ TRANSFER GATE
CMC ⋯ CURRENT MIRROR CIRCUIT
N1~N6 ⋯ N-TYPE FET
VBLL ⋯ SECOND POWER SUPPLY

SENSE AMPLIFIER

SENSE AMPLIFIER

CMC ··· CURRENT MIRROR CIRCUIT
N1~N6 ··· N-TYPE FET
VBLL ··· SECOND POWER SUPPLY

SN ··· DATA SENSE NODE
BSN ··· REFERENCE SENSE NODE
TGL1, TGL2 ··· TRANSFER GATE

200

SEMICONDUCTOR MEMORY DEVICE AND METHOD FOR DRIVING SEMICONDUCTOR MEMORY DEVICE

CROSS-REFERENCE TO RELATED APPLICATION

This application is based upon and claims the benefit of priority from the prior Japanese Patent Application No. 2005-327081, filed on Nov. 11, 2005, the entire contents of which are incorporated herein by reference.

BACKGROUND OF THE INVENTION

1. Field of the Invention

The present invention relates to a semiconductor memory device and a method for driving a semiconductor memory device.

2. Related Art

In recent years, there has been known an FBC (floating body cell) memory as a semiconductor memory device expected to replace DRAM. The FBC memory includes a sense amplifier. The sense amplifier is connected to a memory cell through a bit line pair so as to read data stored in the memory cell. During data read or data write, one of the paired bit lines transmits the data to the sense amplifier from the memory-cell-whereas other bit lines transmit a reference voltage to the sense amplifier through a dummy cell.

Furthermore, normally, the sense amplifier includes a current-mirror load circuit constituted by an FET opposite in conduction type to the memory cell. If the memory cell is, for example, an n-FET, the current mirror load circuit is constituted by a p-MOS. During the data read, the current-mirror load circuit applies an equal current to the memory cell and the dummy cell from a high voltage source through a sense node pair, respectively. If it is assumed that the data is "1" when the number of holes of the memory cell is large and that the data is "0" when the number of holes is small, the memory cell that stores the data "1" is lower in threshold voltage than the memory cell that stores the data "0". In this case, a potential of the sense node that detects the data "1" is lower than that of the sense node that detects the data "0". Accordingly, if the data is amplified, then the sense node that detects the data "1" is amplified to relatively a low potential and the sense node that detects the data "0" is amplified to relatively a high potential. Namely, during the data read, the data is latched by the sense node pair while the data "0" and the data "1" are inverted. It is, therefore, necessary to invert the connection relationship between the sense node pair and the bit line pair during the data write from that during the data read. To invert the connection relationship between the sense node pair and the bit line pair, it is disadvantageously necessary to provide an additional circuit. Accordingly, as a result, a chip size of an entire semiconductor memory device is disadvantageously made large.

Normally, in the sense amplifier, after the data is amplified, the bit line pair is disconnected from the sense node pair. If a period between the amplification time and the disconnection time is too short or the disconnection time is present prior to the amplification time, a sense node capacity is reduced before the amplification time. Accordingly, the data is apt to be influenced by noise deriving from crosstalk between the sense node pair. This can disadvantageously make the sense amplifier erroneously detect the data. On the other hand, if the period between the amplification time and the disconnection time is too long, the data is latched by the sense nodes in opposite sign. Accordingly, the bit lines can be driven in opposite sign to that of the data to be stored during the data write in a refresh operation. Besides, the refresh operation is disadvantageously elongated and power loss is increased. As can be seen, the relationship between the noise problem and the power loss or the like is a trade-off relationship with respect to timings of data amplification and the disconnection of the bit line pair from the sense node pair (see Japanese Patent Application Laid-open No. 2004-120628).

SUMMARY OF THE INVENTION

A semiconductor memory device according to an embodiment of the present invention comprises a memory cell including a floating body in an electrically floating state, a first diffusion layer and a second diffusion layer intervening the floating body, and storing data depending on the number of a plurality of majority carriers within the floating body; a word line connected to a gate of the memory cell; a data bit line connected to the first diffusion layer and transmitting the data stored in the memory cell; a reference bit line transmitting a reference voltage; a data sense node connected to the data bit line and transmitting the data in the memory cell; a reference sense node connected to the reference bit line and transmitting the reference voltage; a plurality of transfer gates connected between the data bit line and the data sense node and between the reference bit line and the reference sense node, respectively; and a current load circuit connected to each of the data sense node and the reference sense node and constituted by a transistor equal in conduction type to the memory cell.

A method for driving a semiconductor memory device according to an embodiment of the present invention, the semiconductor memory device comprising a memory cell including a floating body in an electrically floating state and storing data depending on the number of a plurality of majority carriers within the floating body; a word line connected to the memory cell; a data bit line transmitting the data stored in the memory cell which is connected to a diffusion layer of the memory cell; a reference bit line transmitting a reference voltage; a data sense node connecting to the data bit line; a reference sense node connecting to the reference bit line; a transfer gate connecting between the data bit line and the data sense node and between the reference bit line and the reference sense node and including a first transistor opposite in conduction type to the memory cell; and a current load circuit connected to each of the data sense node and the reference sense node and constituted by a transistor equal in conduction type to the memory cell, the method comprises transmitting the data from the data bit line to the data sense node and transmitting the data from the reference bit line to the reference sense node by making the first transistor conductive, when the data is read out from the memory cell.

DETAILED DESCRIPTION OF THE INVENTION

Hereafter, embodiments of the present invention will be explained with reference to the drawings. Note that the invention is not limited by the embodiments.

First Embodiment

Figure 1:
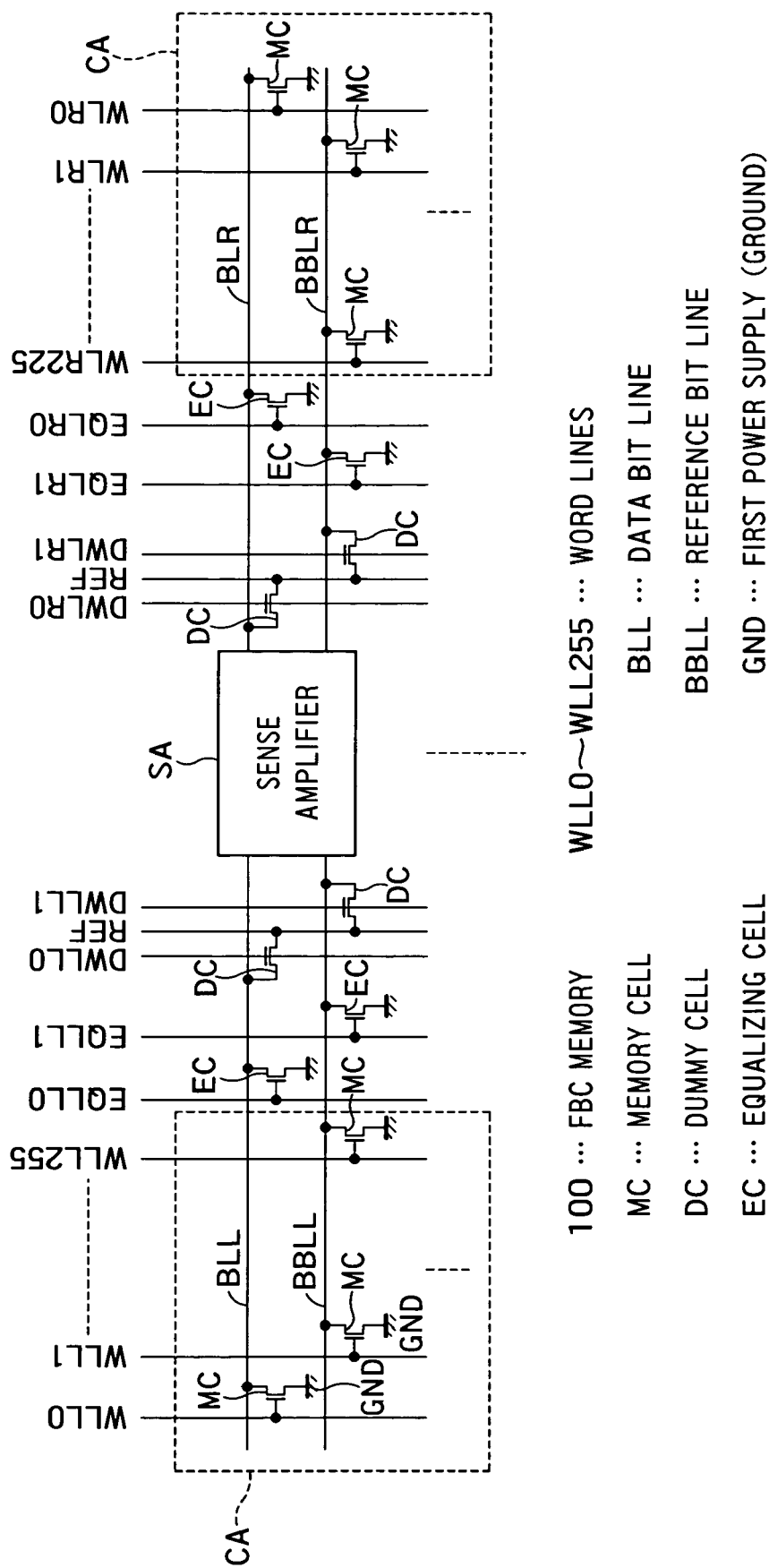
FIG. 1 is a partial circuit diagram of an FBC memory 100 according to a first embodiment of the present invention.

FIG. 1 is a partial circuit diagram of an FBC memory 100 according to a first embodiment of the present invention. The FBC memory 100 includes memory cells MC, dummy cells DC, a sense amplifier SA, bit lines BLL, BBLL, BRL, and BBLR, word lines WLL0 to WLL225 and WLR0 to WLR225, dummy word lines DWLL0, DWLL1, DWLR0, and DWLR1, and equalizing lines EQLL0, EQLL1, EQLR0, and EQLR1.

Each memory cell MC is an n-MOS transistor that includes a floating body (hereinafter, also simply referred to as "body region") provided on a silicon on insulator (SOI) substrate. Namely, the memory cell MC is an n-type FBC. The memory cell MC stores binary data (data "1" or "0") depending on the number of carriers accumulated in the body region, e.g., the number of holes. For convenience's sake, when the number of holes in the body region is large, the data stored in the memory cell is assumed as "1". When the number of holes is small, the data is assumed as "0".

The memory cells MC are arranged in a matrix and constitute a cell array CA. In FIG. 1, the memory cells MC are arranged to be shifted at half-pitch intervals. Two cell arrays CA are provided on both sides of a sense amplifier SA, respectively, and the sense amplifier SA is shared between the both cell arrays CA. It is noted, however, that the sense amplifier SA is temporarily connected only to one of the cell arrays CA. Therefore, the left cell array CA shown in FIG. 1 will be mainly explained herein whereas the explanation of the right cell array CA shown in FIG. 1 is omitted.

In the cell array CA, the bit lines BLL and BBLL are provided in a column direction and the word lines WLL0 to WLL255 are provided in a row direction. For convenience's sake, the bit lines BLL and BBLL are shown in a horizontal direction and the word lines WLL0 to WLL255 are shown in a vertical direction in FIG. 1.

The bit lines BLL and BBLL constitute a bit line pair. One of the bit line pair BLL and BBLL functions as a data bit line that transmits data stored in the memory cell MC whereas other bit line function as a reference bit line that transmits a reference voltage.

The FBC memory 100 according to the first embodiment includes the sense amplifier SA per bit line pair. Namely, the FBC memory 100 has a dynamic sense amplifier configuration. The dynamic sense amplifiers are advantageous in that holes lost by a charge pumping phenomenon can be supplied in each cycle and in that a refresh busy rate can be suppressed low.

A drain of the memory cell MC is connected to one of the bit lines BLL and BBLL. A source of the memory cell MC is connected to a ground GND serving as a first power supply. A gate of the memory cell MC is connected to one of the word lines WLL0 to WLL255. By doing so, the data stored in the memory cell MC selected by the word line can be transmitted to the sense amplifier SA through the bit line.

The FBC memory 100 also includes equalizing cells EC and dummy cells DC. The equalizing cell EC is used to pre-charge a bit line. The dummy cell DC is connected between a reference voltage REF and the bit line pair BLL, BBLL. If the bit line BLL transmits the data stored in the memory cell MC to the sense amplifier SA during data read, the dummy cell DC connected to the bit line BBLL connects the reference voltage REF to the bit line BBLL. By doing so, the bit line BBLL transmits the reference voltage to the sense amplifier SA. Conversely, if the bit line BBLL transmits the data stored in the memory cell MC, the dummy cell DC connected to the bit line BLL connects the reference voltage REF to the bit line BLL.

For facilitating understanding, one sense amplifier SA and the bit line pairs corresponding to the sense amplifier SA are shown in FIG. 1. Normally, however, such sense amplifiers SA and such bit line pairs are arranged in large quantities in the FBC memory 100.

Figure 2:
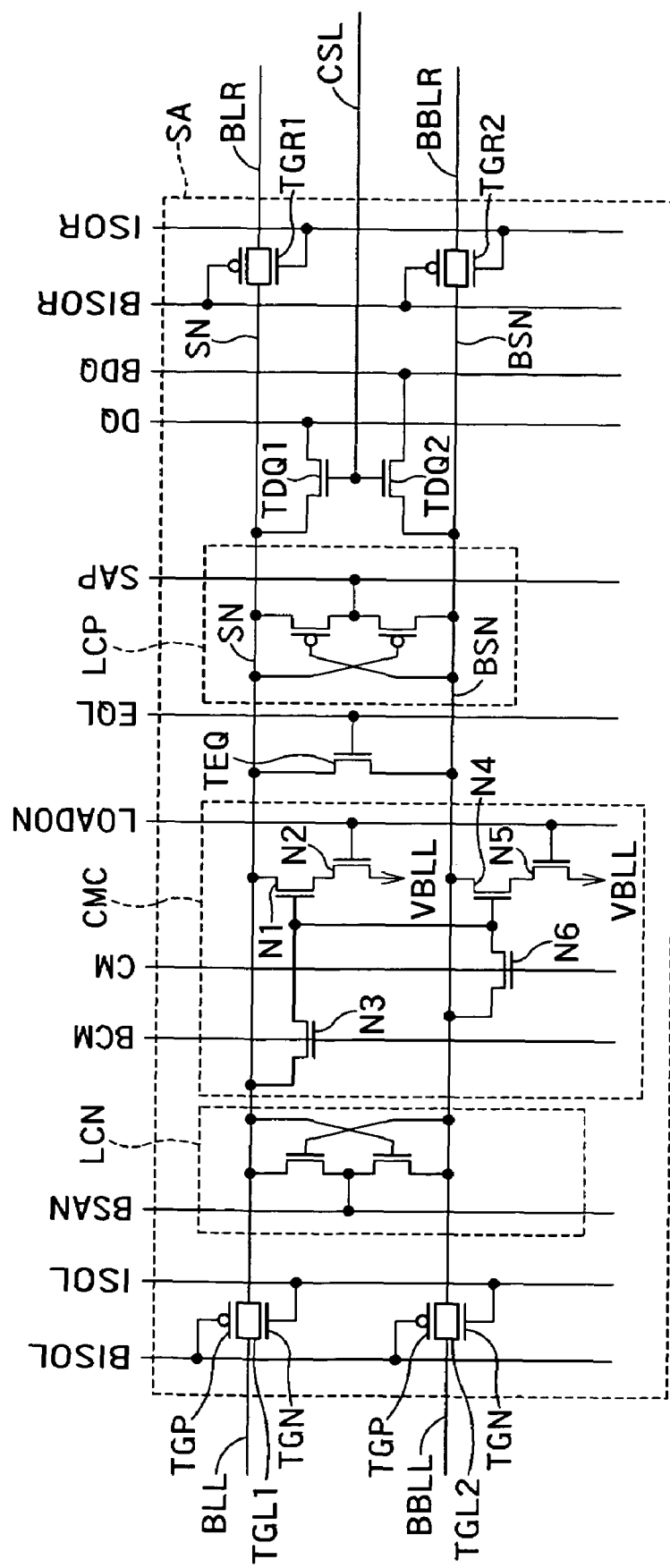
FIG. 2 is a circuit diagram that depicts a configuration of the sense amplifier SA.

FIG. 2 is a circuit diagram that depicts a configuration of the sense amplifier SA. The sense amplifier SA includes transfer gates TGL1, TGL2, TGR1, and TGR2. The transfer gate TGL1 is connected between the bit line BLL and a sense node SN. The transfer gate TGL2 is connected between the bit line BBLL and a sense node BSN. The transfer gate TGR1 is connected between the bit line BLR and the sense node SN. The transfer gate TGR2 is connected between the bit line BBLR and the sense node BSN.

Each of the transfer gates TGL1, TGL2, TGR1, and TGR2 is constituted by an n-FET (TGN) and a p-FET (TGP) connected in parallel. Signals ISOL and BISOL drive the n-FET and the p-FET that constitute each of the transfer gates TGL1 and TGL2, respectively.

The sense amplifier SA is connected only to the bit line pair BLL and BBLL or the bit line pair BLR and BBLR, and reads data from the connected bit line pair or writes data therefrom. Accordingly, when the transfer gates TGL1 and TGL2 operate, the transfer gates TGR1 and TGR2 are always turned off. Conversely, when the transfer gates TGR1 and TGR2 operate, the transfer gates TGL1 and TGL2 are always turned off.

The sense amplifier SA includes a latch circuit LCN constituted by two n-FETs and a latch circuit LCP constituted by two p-FETs. The two n-FETs are connected in series between the sense nodes SN and BSN and gates of the respective n-FETs are cross-coupled with each other. A signal BSAN is input between the two n-FETs. The two p-FETs are connected in series between the sense nodes SN and BSN and gates of the respective p-FETs are cross-coupled with each other. A signal SAP is input between the two p-FETs.

A current mirror circuit CMC, which serves as a current load circuit, includes n-transistors N1 to N6 equal in conduction type to the memory cell MC. The transistors N1 and N2 are connected in series between the sense node SN and a second power supply VBLL. The second power supply VBLL is lower in potential than the ground GND serving as the first power supply. For example, the second power supply VBLL can be a low-level potential applied to the bit lines in a data "0" writing operation. A current from the ground GND shown in FIG. 1, therefore, is carried to the second power supply VBLL through the memory cell MC and the bit line.

The transistor N3 is connected between a gate of the transistor N1 and the sense node SN. The transistor N3 can connect or disconnect the gate of the transistor N1 to or from the sense node SN under control of a signal BCM. A gate of the transistor N2 can connect or disconnect the transistor N1 to or from the second power supply VBLL under control of a signal LOADON.

The transistors N4 and N5 are connected in series between the sense node BSN and the second power supply VBLL. The transistor N6 is connected between a gate of the transistor N4 and the sense node BSN. The transistor N6 can connect or disconnect the gate of the transistor N4 to or from the sense node BSN under control of a signal CM. A gate of the transistor N5 can connect or disconnect the transistor N4 to or from the second power supply VBLL under control of the signal LOADON.

The gate of the transistor N1 is connected to that of the transistor N4. The transistors N1 and N4 are equal in size (W(gate width)/L(gate length)) and smaller in size than the transistors N2 and N5. Therefore, the current carried from the sense node SN to the second power supply VBLL through the transistors N1 and N2 and the current carried from the sense node BSN to the second power supply VBLL through the transistors N4 and N5 are determined by the transistors N1 and N4, respectively. In addition, the both currents are equal. Namely, the transistors N1 and N4 substantially act as constant-current sources whereas the transistors N2 and N5 act simply as switches. As can be seen, the current mirror circuit CMC, which is connected to the sense nodes SN and BSN by current mirror connection, can make the current applied to the sense node SN and the bit line BLL equal to the current applied to the sense node BSN and the bit line BBLL.

A transistor TEQ, which is an equalizing transistor, is provided to pre-charge the sense nodes SN and BSN under control of a signal EQL.

Transistors TDQ1 and TDQ2 are provided to transmit a signal amplified by the sense amplifier SA to a DQ buffer (not shown) or a signal from the DQ buffer to the sense amplifier SA. During the data read, the signal buffered in the DQ buffer is output to an outside. During the data write, the signal buffered in the DQ buffer is input from the outside.

Conventionally, the current mirror circuit provided in the sense amplifier is constituted by the transistor opposite in conduction type to the memory cell MC. Accordingly, the second power supply within the current mirror circuit is higher in voltage than the first power supply (e.g., the ground) connected to the source of the memory cell MC. This results in the conventional disadvantages.

According to this embodiment, in contrast, the current mirror circuit CMC is constituted by the transistors equal in conduction type to the memory cell MC. Accordingly, the second power supply is lower in voltage than the first power supply. As a result, the data is latched by the sense node pair in a non-inverted state. According to this embodiment, therefore, it is unnecessary to provide an additional transfer gate for inverting the connection relationship between the bit line pair and the sense node pair.

Operations performed by the FBC memory 100 will next be explained. For convenience's sake, the word line WLL0 and the dummy word line DWLL1 are assumed to be selected. In addition, it is assumed that the bit line BLL functions as the data bit line for transmitting the data stored in the memory cell MC, and that the bit line BBLL functions as the reference bit line for transmitting the reference data. Accordingly, the sense node SN connected to the bit line BLL functions as a data sense node for detecting the data stored in the memory cell MC. The sense node BSN connected to the bit line BBLL functions as a reference sense node for detecting the reference data.

The operation principle of the FBC memory 100 will be briefly explained. It is assumed herein that the data in a state in which the number of holes stored in the body region is large is the data "1", and that the data in a state in which the number of holes is small is the data "0". In this case, a threshold voltage Vth1 of the memory cell MC that stores the data "1" is lower than a threshold voltage Vth0 of the memory cell MC that stores the data "0" due to a body effect. For this reason, when the gate voltage is equal, a current carried between the drain and the source of the memory cell MC that stores the data "1" is higher than that of the memory cell MC that stores the data "0".

For example, a constant voltage of about 1 volt is applied to the word line WLL0 and a voltage of about 0.2 volt is applied to the data bit line BLL. The current carried to the sense node SN at this time is compared with the reference current carried to the reference sense node BSN. The reference current is an intermediate value between the current carried to the data sense node SN when the data is "1" and the current carried to the data sense node SN when the data is "0". The sense amplifier SA can thereby discriminately detect the data "1" and the data "0".

To write the data "1", high potential voltages are applied to the word line WLL0 and the bit line BLL, respectively. For example, a voltage of about 1.5 volts and a voltage of about 2 volts are applied to the word line WLL0 and the bit line BLL, respectively. By doing so, the memory cell MC operates in a saturating state, thereby causing impact ionization. Holes generated by this impact ionization are accumulated in the body region, thereby storing the data "1" in the memory cell MC.

To write the data "0", a voltage equal to the voltage for writing the data "1" (e.g., 1.5 volts) is applied to the word line WLL0 and a negative low voltage (e.g., −1 volt) is applied to the bit line BLL. At this time, a pn junction between the body region and the drain is biased in forward direction. The holes in the body region are thereby eliminated and the data "0" is stored in the memory cell MC.

FIGS. 3 to 8 are timing charts of the operations performed by the FBC memory 100 according to the first embodiment. Referring to FIGS. 3 to 8, a refresh operation of the FBC memory 100 will be explained. The refresh operation is an operation for temporarily reading the data stored in the memory cell MC, latching this data in the sense amplifier SA, and then writing the same data to the same memory cell MC.

Figure 4:
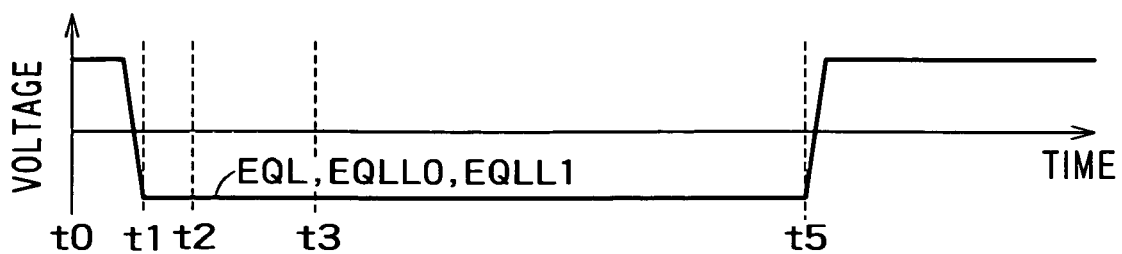
FIG. 4 is a timing chart showing an operation of the FBC memory 100 according to the first embodiment.

As shown in FIG. 4, at a precharge time (t0), signals EQL, EQLL0, and EQLL1 are at high level. The bit line pair BLL and BBLL are equalized to the ground voltage. In addition, the sense node pair SN and BSN are equalized.

Figure 6:
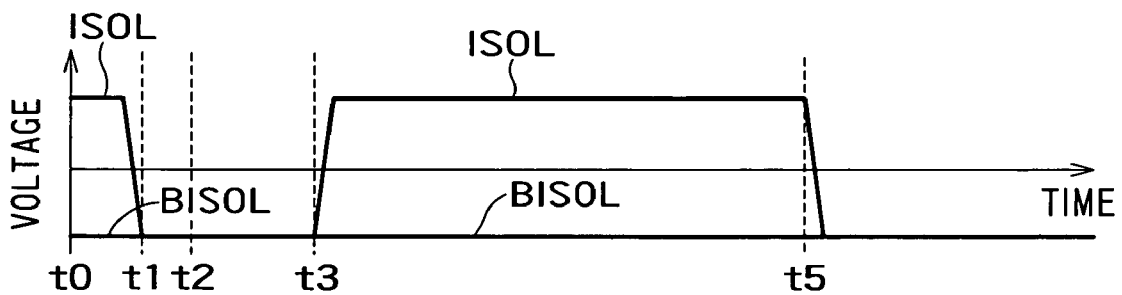
FIG. 6 is a timing chart showing an operation of the FBC memory 100 according to the first embodiment.
Figure 7:
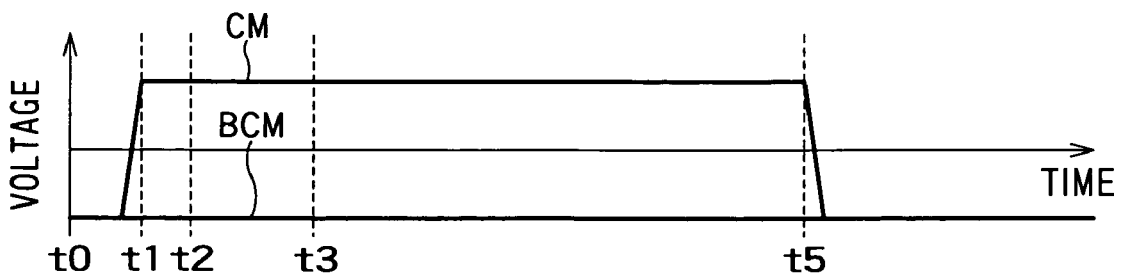
FIG. 7 is a timing chart showing an operation of the FBC memory 100 according tot he first embodiment.

As shown in FIG. 6, at the time t0, the signal ISOL is at a high level and the signal BISOL is at a low level. Therefore, the p-FET and the n-FET that constitute each of the transfer gates TGL1 and TGL2 are both turned on, so that the sense node pair SN and BSN are connected to the bit line pair BLL and BBLL. The sense node pair SN and BSN are equalized to the ground potential similarly to the bit line pair BLL and BBLL, accordingly. At this time, the signal ISOR is at the high level and the signal BISOR is at the low level. The bit line pair BLR and BBLR are, therefore, connected to the sense node pair SN and BSN.

As shown in FIG. 4, before a read operation when the signals EQL, EQLL0, and EQLL1 fall to low levels, the sense node pair SN and BSN and the bit line pair BLL and BBLL turn into floating states, respectively. At the same time, the signals ISOR and BISOR are made low and high levels, respectively. As a result, the bit line pair BLR and BBLR are disconnected from the sense node pair SN and BSN, and the sense amplifier SA receives the data and the reference voltage from the bit line pair BLL and BBLL. As shown in FIG. 6, when the signal ISOL is at the low level at the time t1, the n-transistors TGNs shown in FIG. 2 are turned off. At the same time, a signal CM shown in FIG. 7 rises. The current mirror circuit CMC, thereby, applies a cell current to the sense node SN and the reference current to the sense node BSN.

Figure 3:
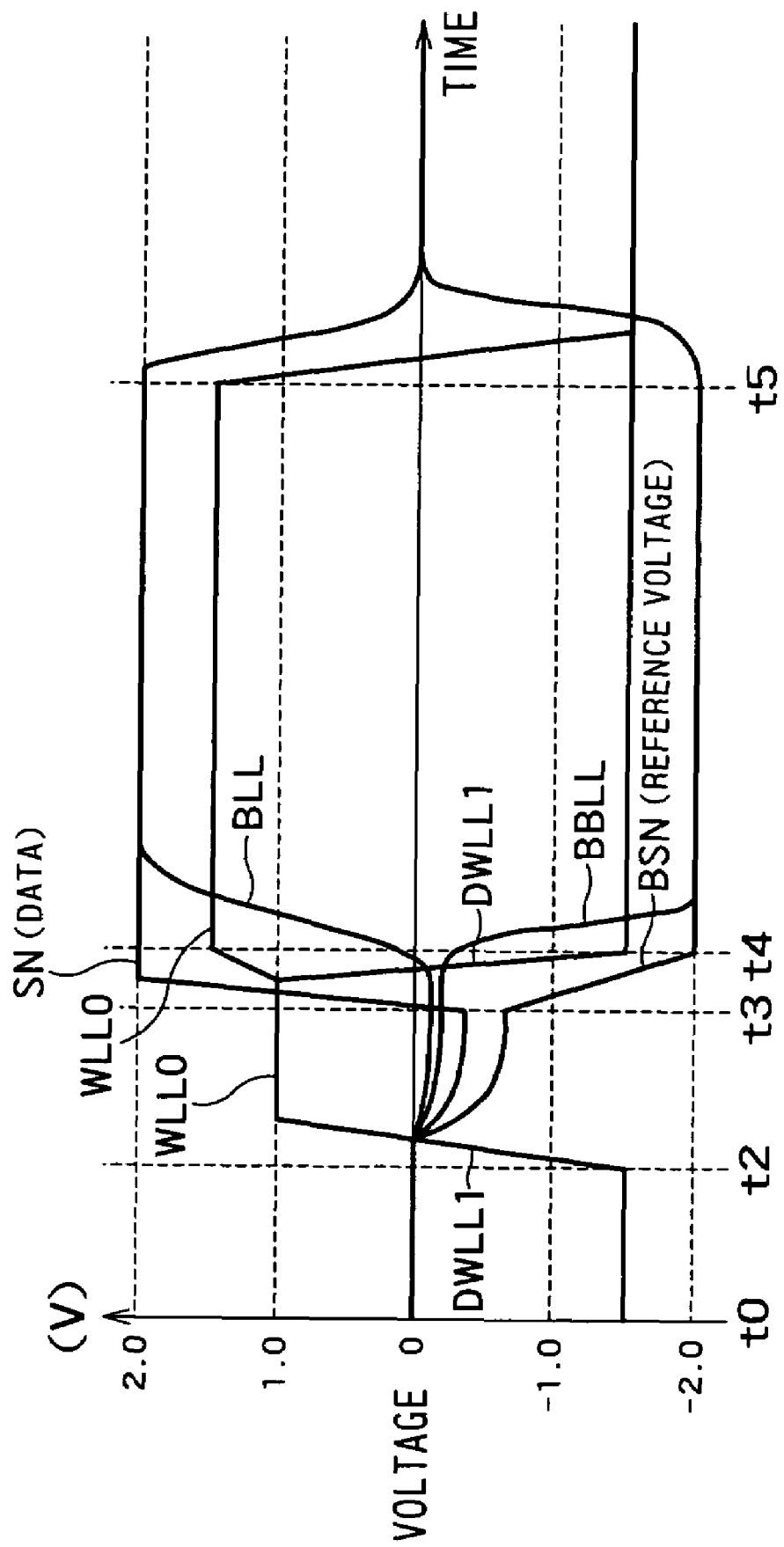
FIG. 3 is a timing chart showing an operation of the FBC memory 100 according to the first embodiment.
Figure 8:
FIG. 8 is a timing chart showing an operation of the FBC memory 100 according to the first embodiment.

As shown in FIG. 3, at a time t2, the word line WLL0 and the dummy word line DWLL1 rise and, at the same time, the signal LOADON shown in FIG. 8 rises. The current is thereby applied to the current mirror circuit CMC. At this moment, since the second power supply VBLL is lower in voltage than the first power supply (GND), the current is carried from the first power supply (GND) to the second power supply VBLL. As shown in FIG. 3, a small signal generated by the data from the memory cell MC and the reference signal from the dummy cell DC are pre-amplified in a negative direction at the sense node pair SN and BSN, respectively. A voltage based on the data "1" or "0" is generated at the data sense node SN and a reference voltage is generated at the reference sense node BSN.

In this read operation, the p-FET opposite in conduction type to the memory cell MC is made conductive in each of the transfer gates TGL1 and TGL2. It is thereby possible to generate a large signal during signal pre-amplification.

When the data from the memory cell MC is "1", the potential of the data sense node SN is developed to a higher state than that of the reference sense node BSN. Conversely, when the data from the memory cell MC is "0", the potential of the data sense node SN is developed to a lower state than that of the reference sense node BSN. This is because the threshold voltage of the memory cell MC that stores the data "1" is lower than that of the memory cell MC that stores the data "0". In addition, the second power supply VBLL connected to the current mirror circuit CMC is lower in potential than the first power supply GND connected to the memory cell MC.

In the graph of FIG. 3, the potential of the data sense node SN is higher than that of the reference sense node BSN. It is, therefore, seen that, in the first embodiment, the sense amplifier SA detects the data "1".

Figure 5:
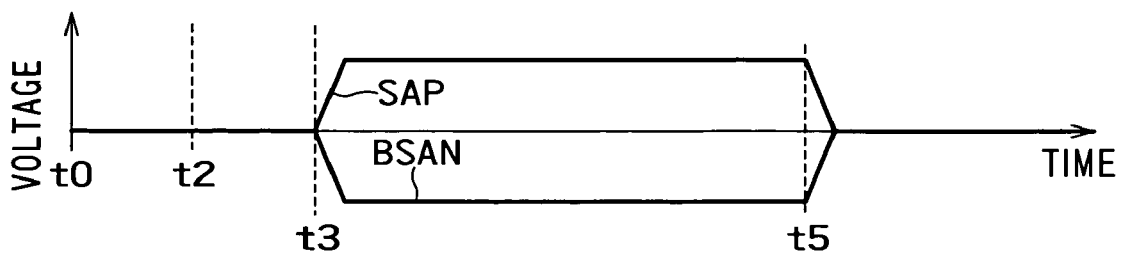
FIG. 5 is a timing chart showing an operation of the FBC memory 100 according to the first embodiment.

At times t3 to t4, when the signals SAP and BSAN shown in FIG. 5 are set high and low levels, the signals developed at the sense node pairs SN and BSN are amplified and latched by the latch circuits LCN and LCP, respectively. At this time, when the data is "1", the potential of the sense node SN is amplified to the higher state than that of the reference voltage. When the data is "0", the potential of the sense node SN is amplified to the lower state than that of the reference voltage. In other words, the data "1" or "0" is amplified and latched by the sense nodes SN and BSN in the non-inverted state.

At the times t3 to t4, the signal ISOL shown in FIG. 6 rises to the high level. The n-transistor TGN and the p-transistor TGP that constitute each of the transfer gates TGL1 and TGL2 are thereby both turned on.

When the amplification operation ends, the signal LOADON shown in FIG. 8 falls to the low level. The current mirror circuit CMC thereby stops carrying the cell current. At this moment, the sense node pair SN and BSN latch the read data. The sense amplifier SA thus reads the data stored in the memory cell MC.

At the time t4, the word line WLL0 is set to have a high potential (e.g., 1.5 volts) and the data at the sense node SN is rewritten to the memory cell MC. The bit line pair BLL and BBLL are connected to the sense node pair SN and BSN through the transfer gates TGL1 and TGL2, respectively. At this time, the n-FETs equal in conduction type to the memory cell MC in the transfer gates TGL1 and TGL2 are made conductive. It is thereby ensured that the data is transmitted from the data sense node SN to the data bit line BLL and that the data is transmitted from the reference sense node BSN to the reference bit line BBLL. As a result, the data amplified by the sense amplifier SA is transmitted to the bit line BLL through the sense node SN. The bit line BLL is, therefore, made equal in potential to the sense node SN.

When the data "1" is rewritten to the memory cell MC, the bit line BLL rises to a high potential (e.g., 2 volts). It should be noted that the sense node pair SN and BSN latch the data in the non-inverted state. By doing so, it is unnecessary to invert the data at the sense node pair SN and BSN during the data write. When the potential of the sense node SN is transmitted to the bit line BLL as it is, the bit line BLL can be raised to the high potential. Namely, it is unnecessary to change the connection relationship between the sense node pair SN and BSN and the bit line pair BLL and BBLL between the data read time and the data write time.

After the time t4, the operations performed by the FBC memory 100 can be equal to those performed by the conventional FBC memory. The refresh operation is thereby completed.

FIG. 3 shows the refresh operation of the memory cell MC for storing the data "1". The refresh operation of the memory cell MC for storing the data "0" may be performed by inverting levels of the read data and the write data shown in FIG. 3, and other operations can be equal to those shown in FIG. 3.

Figure 9:
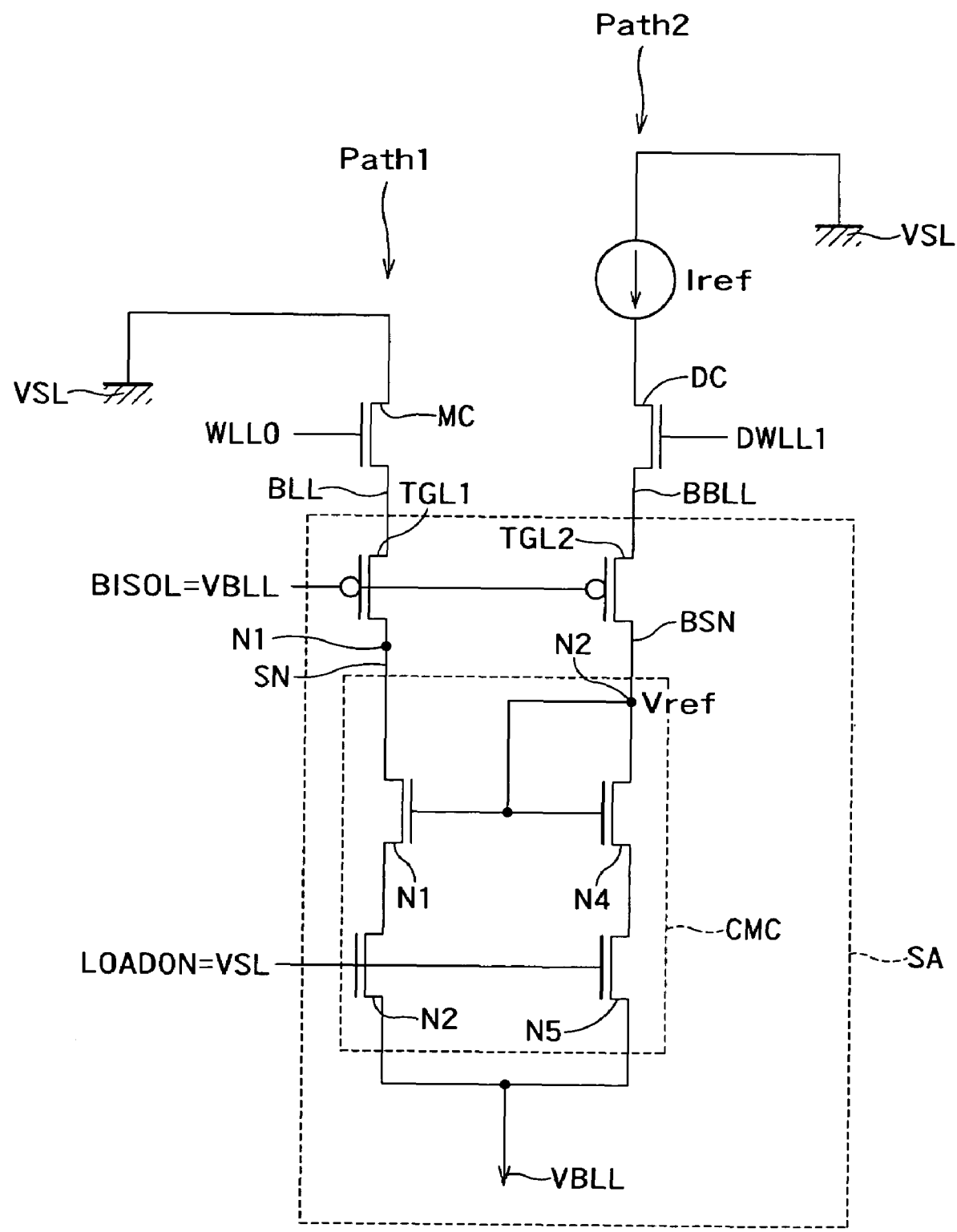
FIG. 9 is an equivalent partial circuit diagram of the FBC memory 100 during the data read.

FIG. 9 is an equivalent partial circuit diagram of the FBC memory 100 during the data read. This equivalent circuit includes a path 1 connected to the memory cell MC and carrying the cell current, and a path 2 connected to the constant-current source through the dummy cell DC and carrying the reference current.

The signal BISOL is input to the gates of the transfer gates TGL1 and TGL2. During the data read, only the p-FETs in the transfer gates TGL1 and TGL2 are turned on. In FIG. 9, therefore, it is shown that the transfer gates TGL1 and TGL2 are p-FETs.

Figure 10:
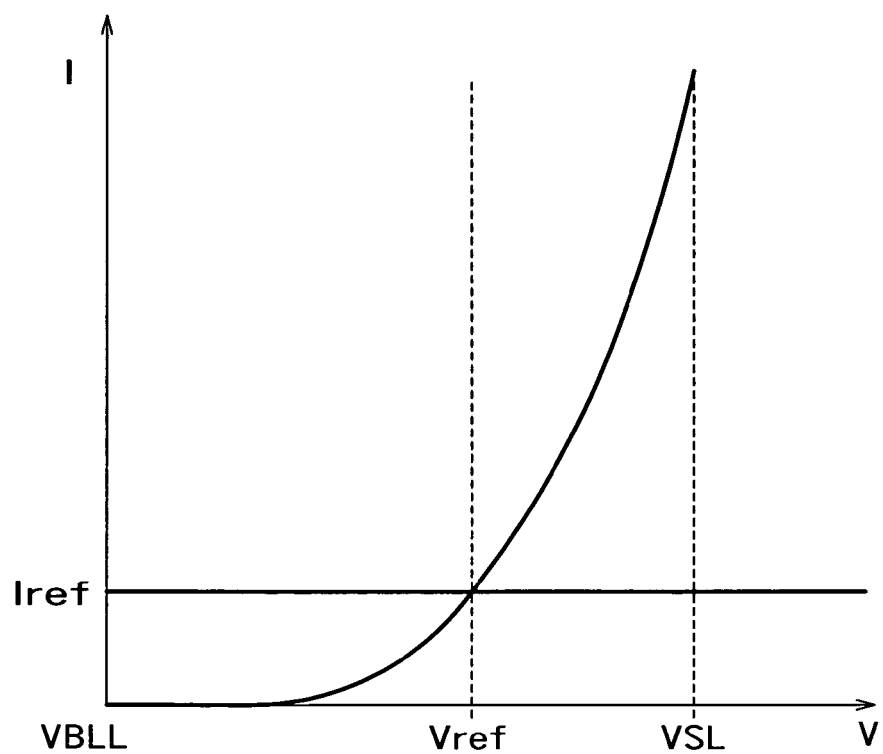
FIG. 10 is a graph of an I-V characteristic of the path 2.

FIG. 10 is a graph of an I-V characteristic of the path 2. This I-V characteristic is a characteristic at the node N2. The node N2 is arranged between the transfer gate TGL2 and the current mirror circuit CMC. Since the reference current Iref carried on the path 2 is constant, an intersecting point between this I-V characteristic and the reference current Iref indicates the reference voltage Vref. The reference voltage Vref is applied to the gates of the transistors N1 and N4 on the path 1.

Figure 11:
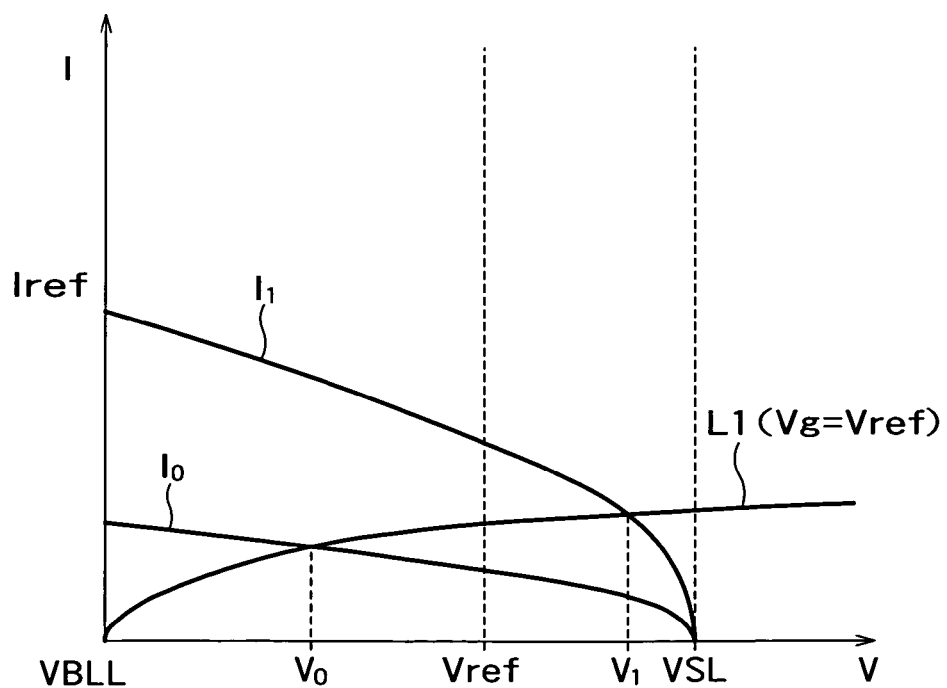
FIG. 11 is a graph of an I-V characteristic of the path 1.

FIG. 11 is a graph of an I-V characteristic of the path 1. This I-V characteristic is a characteristic at the node N1. The node N1 is arranged between the transfer gate TGL1 and the current mirror circuit CMC. A driver characteristic at the node N1 differs depending on whether the data stored in the memory cell MC is "1" or "0". A curve I1 shown in FIG. 11 indicates the driver characteristic when the data stored in the memory cell MC is "1". A curve I0 shown in FIG. 11 indicates the driver characteristic when the data is "0". A curve L1 indicates a load characteristic at the node N1 when a gate voltage Vg of the transistor N1 is Vref.

A voltage V1 of the data sense node SN at which the data "1" is amplified is determined by an intersecting point between the curves L1 and I1. A voltage V0 of the data sense node SN at which the data "0" is amplified is determined by an intersecting point between the curves L1 and I0. By comparing the potential of the data sense node SN with the reference voltage Vref, it is possible to discriminate the data "1" from the data "0".

According to the first embodiment, the connection relationship between the sense node pair SN and BSN and the bit line pair BLL and BBLL is equal between the data read time and the data write time. It is, therefore, unnecessary to provide the additional transfer gate for cross-coupling the sense node pair SN and BSN to the bit line pair BLL and BBLL. As a result, the FBC memory 100 is simpler in circuit configuration than the conventional FBC memory, thereby reducing chip area.

According to the first embodiment, the data is latched in the non-inverted state by the sense node pair SN and BSN. Since it is unnecessary to invert the data during the data write, crosstalk noise is small. This can reduce the period (t3 to t4) between the data read time and the data write time. This makes it unnecessary to provide a timing margin, thereby enabling accelerating the refresh operation.

Second Embodiment

Figure 12:
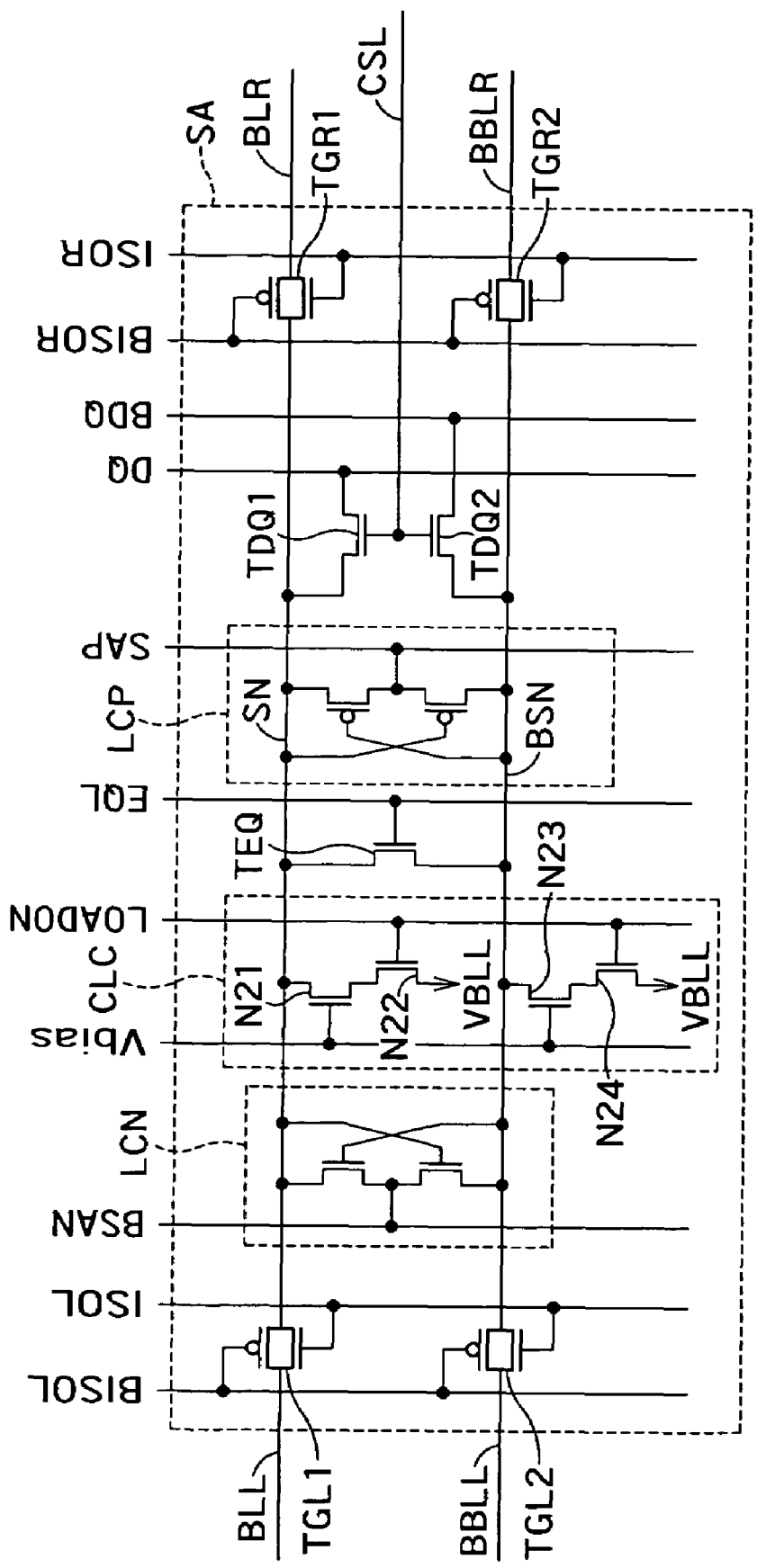
FIG. 12 is a circuit diagram of a sense amplifier SA in an FBC memory 200 according to a second embodiment of the present invention.

FIG. 12 is a circuit diagram of a sense amplifier SA in an FBC memory 200 according to a second embodiment of the present invention. Since constituent elements of the FBC memory 200 according to the second embodiment other than the sense amplifier SA are the same as those shown in FIG. 1, they will not be explained herein.

A current load circuit CLC according to the second embodiment differs in configuration to the current mirror circuit CMC according to the first embodiment. Other constituent elements of the sense amplifier SA according to the second embodiment are the same as those according to the first embodiment.

The current load circuit CLC includes n-transistors N21 to N24 equal in conduction type to the memory cell MC. The transistors N21 and N22 are connected in series between the sense node SN and the second power supply VBLL. The transistors N23 and N24 are connected in series between the sense node BSN and the second power supply VBLL. Gates of the transistors N21 and N23 are connected to a voltage Vbias in common. Gates of the transistors N22 and N24 are connected to the signal LOADON. The transistors N21 and N23 are equal in size (channel width/channel length) and smaller in size than the transistors N22 and N24.

In the second embodiment, the current load circuit CLC is not connected to the sense nodes SN and BSN by current mirror connection. However, the gates of the transistors N21 and N23 are connected tot he common voltage Vbias. This sense amplifier SA can therefore apply the equal current controlled by the transistors N21 and N23 to the sense nodes SN and BSN, respectively.

The voltage Vbias is a constant voltage used to allow both the transistors N21 and N23 to operate in saturating states to carry the equal current. Other operations performed by the FBC memory 200 according to the second embodiment are substantially equal to those performed by the FBC memory 100 according to the first embodiment.

Thus, the second embodiment exhibits the same advantages as those of the first embodiment. Furthermore, the current load circuit CLC according to the second embodiment is fewer in the number of transistors than the current mirror circuit CMC according to the first embodiment by two. In this embodiment, the FBC memory 200 has a dynamic sense amplifier configuration and the sense amplifier SA is provided per bit line pair. To simplify the internal configuration of the sense amplifier SA even slightly is, therefore, quite effective for the reduction in the size of an entire memory device.

Third Embodiment

Figure 13:
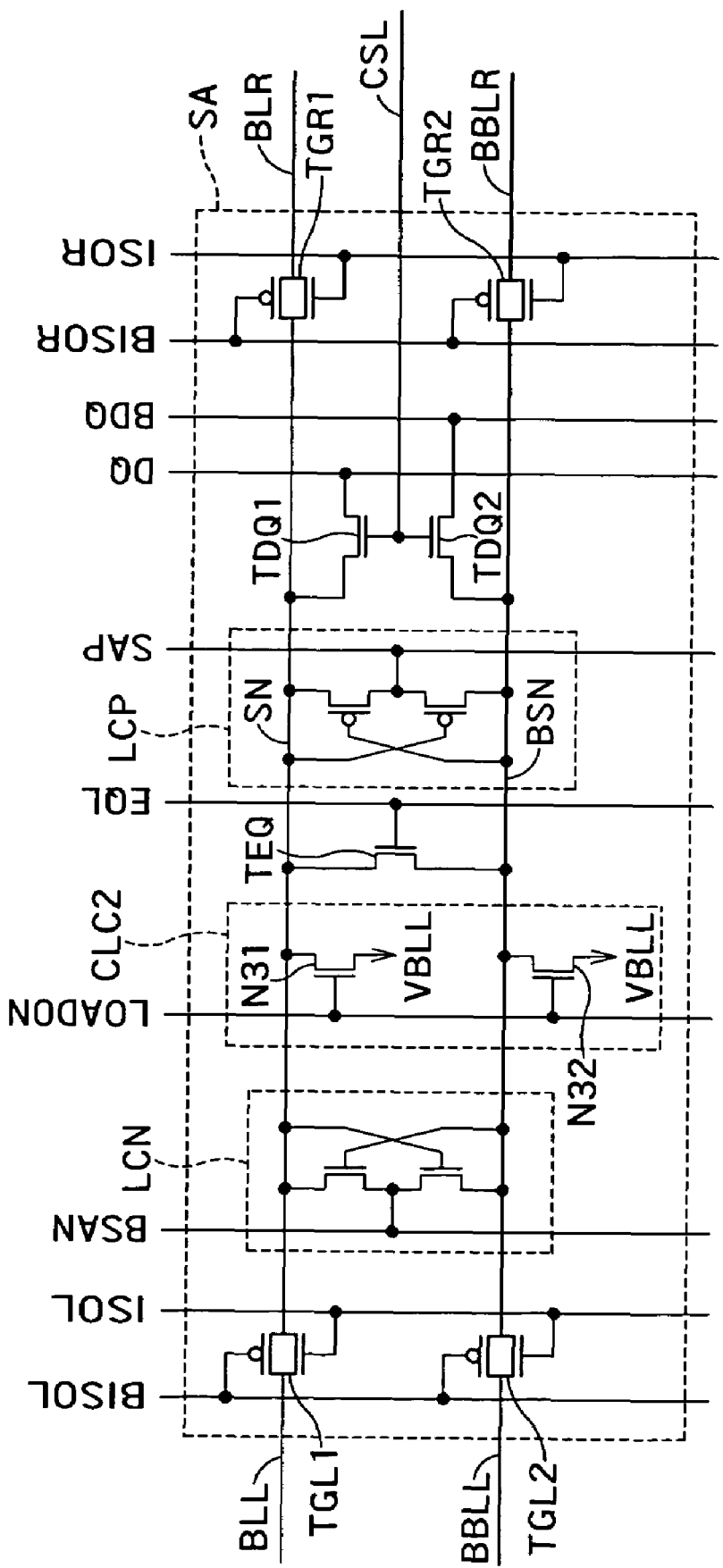
FIG. 13 is a circuit diagram of a sense amplifier SA in an FBC memory 300 according to a third embodiment of the present invention.

FIG. 13 is a circuit diagram of a sense amplifier SA in an FBC memory 300 according to a third embodiment of the present invention. Since constituent elements of the FBC memory 300 according to the third embodiment other than the sense amplifier SA are the same as those shown in FIG. 1, they will not be explained herein.

A configuration of a current load circuit CLC2 according to the third embodiment differs from that of the current load circuit CLC according to the second embodiment. Other constituent elements of the FBC memory 300 according to the third embodiment are the same as those according to the second embodiment.

The current load circuit CLC2 includes n-transistors N31 and N32 equal in conduction type to the memory cell MC. The transistor N31 is connected between the sense node SN and the second power supply VBLL. The transistor N32 is connected between the sense node BSN and the second power supply VBLL. Gates of the transistors N31 and N32 are connected to the signal LOADON in common. The transistors N31 and N32 are equal in size (channel width/channel length) to each other.

In the current load circuit CLC2, the gates of the transistors N31 and N32 are connected to the common signal LOADON. Therefore, this sense amplifier SA can apply the equal current controlled by the transistors N31 and N32 to the sense nodes SN and BSN, respectively. Namely, the signal LOADON according to the third embodiment rises from a low level to a level of the voltage Vbias shown in FIG. 12 and is driven to apply the equal current to the transistors N31 and N32.

Operations performed by the FBC memory 300 according to the third embodiment are substantially equal to those of the FBC memory 100 according to the first embodiment. It is noted that operations performed by the transistors N31 and N32 can be equal to those performed by the transistors N21 and N23 according to the second embodiment.

Thus, the third embodiment exhibits the same advantages as those of the first embodiment. Furthermore, the current load circuit CLC2 according to the second embodiment is fewer in the number of transistors than the current load circuit CLC according to the second embodiment by two. According to the third embodiment, therefore, it is possible to further reduce the chip size of the FBC memory.

It should be noted that there are several other methods for providing reference voltage than shown here. One example is averaging one pair or many pairs of dummy cells with the data "1" and the data "0" written. Another special method should be a twin-cell one where two memory cells MC connected to the word line WLL0 and WLL1 are written opposite data constituting a single bit instead of using dummy cells DC in FIG. 1. In the last case, the two memory cells can be arranged on a single word line WLL0 for example.

The invention claimed is:

1. A semiconductor memory device comprising:
a memory cell including a floating body in an electrically floating state, a first diffusion layer and a second diffusion layer intervening the floating body, and storing data depending on the number of a plurality of majority carriers within the floating body;
a word line connected to a gate of the memory cell;
a data bit line connected to the first diffusion layer and transmitting the data stored in the memory cell;
a reference bit line transmitting a reference voltage;
a data sense node connected to the data bit line and transmitting the data in the memory cell;
a reference sense node connected to the reference bit line and transmitting the reference voltage;
a plurality of transfer gates connected between the data bit line and the data sense node and between the reference bit line and the reference sense node, respectively; and
a current load circuit connected to each of the data sense node and the reference sense node and constituted by a transistor equal in conduction type to the memory cell.

2. The semiconductor memory device according to claim 1, wherein
the current load circuit is a current mirror circuit which includes the transistors equal in conduction type to the memory cell, and which is connected to the data sense node and the reference sense node so as to apply an equal current to the data sense node and the reference sense node.

3. The semiconductor memory device according to claim 1, wherein
the current load circuit includes the transistors equal in conduction type to the memory cell, and applies an equal current to the data sense node and the reference sense node by a common gate signal to the transistors.

4. The semiconductor memory device according to claim 1, wherein
the memory cell and the current load circuit are formed by n-type transistors.

5. The semiconductor memory device according to claim 1, wherein
each of the transfer gates includes a first transistor opposite in conduction type to the memory cell.

6. The semiconductor memory device according to claim 5, wherein
each of the transfer gates includes the first transistor and a second transistor same in conduction type as the memory cell, the first and the second transistors being connected in parallel each other.

7. The semiconductor memory device according to claim 6, wherein
the first transistor is made conductive and the second transistor is made nonconductive, when the data stored in the memory cell is read out.

8. The semiconductor memory device according to claim 6, wherein
both the first and the second transistors are made conductive, when the data is written into the memory cell.

9. The semiconductor memory device according to claim 7, wherein
both the first and the second transistors are made conductive, when the data is written into the memory cell.

10. The semiconductor memory device according to claim 1, wherein
the memory cell is connected between the data bit line and a first power supply,
the current load circuit is connected between the data sense node and a second power supply and between the reference sense node and the second power supply,
the second power supply is set so that the first diffusion layer functions as the source of the memory cell.

11. The semiconductor memory device according to claim 2, wherein
the memory cell is connected between the data bit line and a first power supply,
the current load circuit is connected between the data sense node and a second power supply and between the reference sense node and the second power supply,
the second power supply is set so that the first diffusion layer functions as the source of the memory cell.

12. The semiconductor memory device according to claim 3, wherein
the memory cell is connected between the data bit line and a first power supply,
the current load circuit is connected between the data sense node and a second power supply and between the reference sense node and the second power supply,
the second power supply is set so that the first diffusion layer functions as the source of the memory cell.

13. The semiconductor memory device according to claim 1, wherein
the memory cell is a floating body cell.

14. A method for driving a semiconductor memory device, the semiconductor memory device comprising a memory cell including a floating body in an electrically floating state and storing data depending on the number of a plurality of majority carriers within the floating body; a word line connected to the memory cell; a data bit line transmitting the data stored in the memory cell which is connected to a diffusion layer of the memory cell; a reference bit line transmitting a reference voltage; a data sense node connecting to the data bit line; a reference sense node connecting to the reference bit line; a transfer gate connecting between the data bit line and the data sense node and between the reference bit line and the reference sense node and including a first transistor opposite in conduction type to the memory cell; and a current load circuit connected to each of the data sense node and the reference sense node and constituted by a transistor equal in conduction type to the memory cell, the method comprising:
transmitting the data from the data bit line to the data sense node and transmitting the data from the reference bit line to the reference sense node by making the first transistor conductive, when the data is read out from the memory cell.

15. The method according to claim 14, wherein
the transfer gate includes further a second transistor same in conduction type as the memory cell, the first and the second transistors being connected in parallel;
the method further comprising:
transmitting the data from the data sense node to the data bit line and transmitting the data from the reference sense node to the reference bit line by making both the first and the second transistors conductive, when the data is written to the memory cell.

16. The method according to claim 14, wherein
the memory cell is connected between the data bit line and a first power supply,
the current load circuit is connected between the data sense node and a second power supply and between the reference sense node and the second power supply,
the second power supply is set so that the diffusion layer functions as the source of the memory cell.

17. The method according to claim 14, wherein
the memory cell and the current load circuit are formed by n-type transistors.

18. The method according to claim 14, wherein
the memory cell is formed by a floating body cell.

* * * * *